(12) United States Patent
Durkee

(10) Patent No.: US 12,272,923 B2
(45) Date of Patent: Apr. 8, 2025

(54) LASER DIODE DRIVE SYSTEMS

(71) Applicant: Simmonds Precision Products, Inc., Vergennes, VT (US)

(72) Inventor: Scott R. Durkee, New Haven, VT (US)

(73) Assignee: Simmonds Precision Products, Inc., Vergennes, VT (US)

(*) Notice: Subject to any disclaimer, the term of this patent is extended or adjusted under 35 U.S.C. 154(b) by 841 days.

(21) Appl. No.: 17/505,914

(22) Filed: Oct. 20, 2021

(65) Prior Publication Data

US 2023/0119309 A1 Apr. 20, 2023

(51) Int. Cl.
| | |
|---|---|
| *H01S 5/024* | (2006.01) |
| *H01S 5/042* | (2006.01) |
| *H01S 5/068* | (2006.01) |
| *H02H 3/08* | (2006.01) |

(52) U.S. Cl.
CPC .......... *H01S 5/02461* (2013.01); *H01S 5/042* (2013.01); *H01S 5/06808* (2013.01); *H02H 3/085* (2013.01)

(58) Field of Classification Search
CPC .................................................. H01S 5/06808
USPC ....................................................... 372/38.02
See application file for complete search history.

(56) References Cited

U.S. PATENT DOCUMENTS

| | | | |
|---|---|---|---|
| 5,625,616 A | 4/1997 | Koike et al. | |
| 5,754,577 A | 5/1998 | Casper et al. | |
| 5,974,064 A | 10/1999 | Uchida | |
| 5,999,551 A | 12/1999 | Yoshizawa | |
| 8,605,764 B1 | 12/2013 | Rothaar et al. | |
| 10,866,607 B1* | 12/2020 | Avci | ........................ G01S 7/484 |
| 2002/0186732 A1* | 12/2002 | Moriarty | ............... H01S 5/0687 |
| | | | 372/32 |
| 2006/0291510 A1 | 12/2006 | Juluri | |

FOREIGN PATENT DOCUMENTS

| | | |
|---|---|---|
| CN | 107293938 B | 11/2019 |
| JP | S63229792 A | 9/1988 |
| WO | 2020217355 A1 | 10/2020 |

OTHER PUBLICATIONS

Partial European Search Report issued, of the European Patent Office, mailed on Mar. 10, 2023, in corresponding European Patent Application No. 22200964.9.
Extended European Search Report issued, of the European Patent Office, mailed on Jun. 15, 2023, in corresponding European Patent Application No. 22200964.9.

* cited by examiner

*Primary Examiner* — Tuan N Nguyen
(74) *Attorney, Agent, or Firm* — Kinney & Lange, P.A.

(57) ABSTRACT

A laser diode drive system configured to output a drive signal to control a voltage provided to a laser diode can include a circuit sensor system configured to output a sensed signal indicative of a drive current of a laser diode, and a temperature sensor configured to output a temperature signal indicative of a temperature of the laser diode or an ambient temperature of the laser diode. The system can include a temperature compensation system configured to output a correction signal based on the temperature signal to compensate for a temperature dependent factor in the sensed signal.

12 Claims, 1 Drawing Sheet

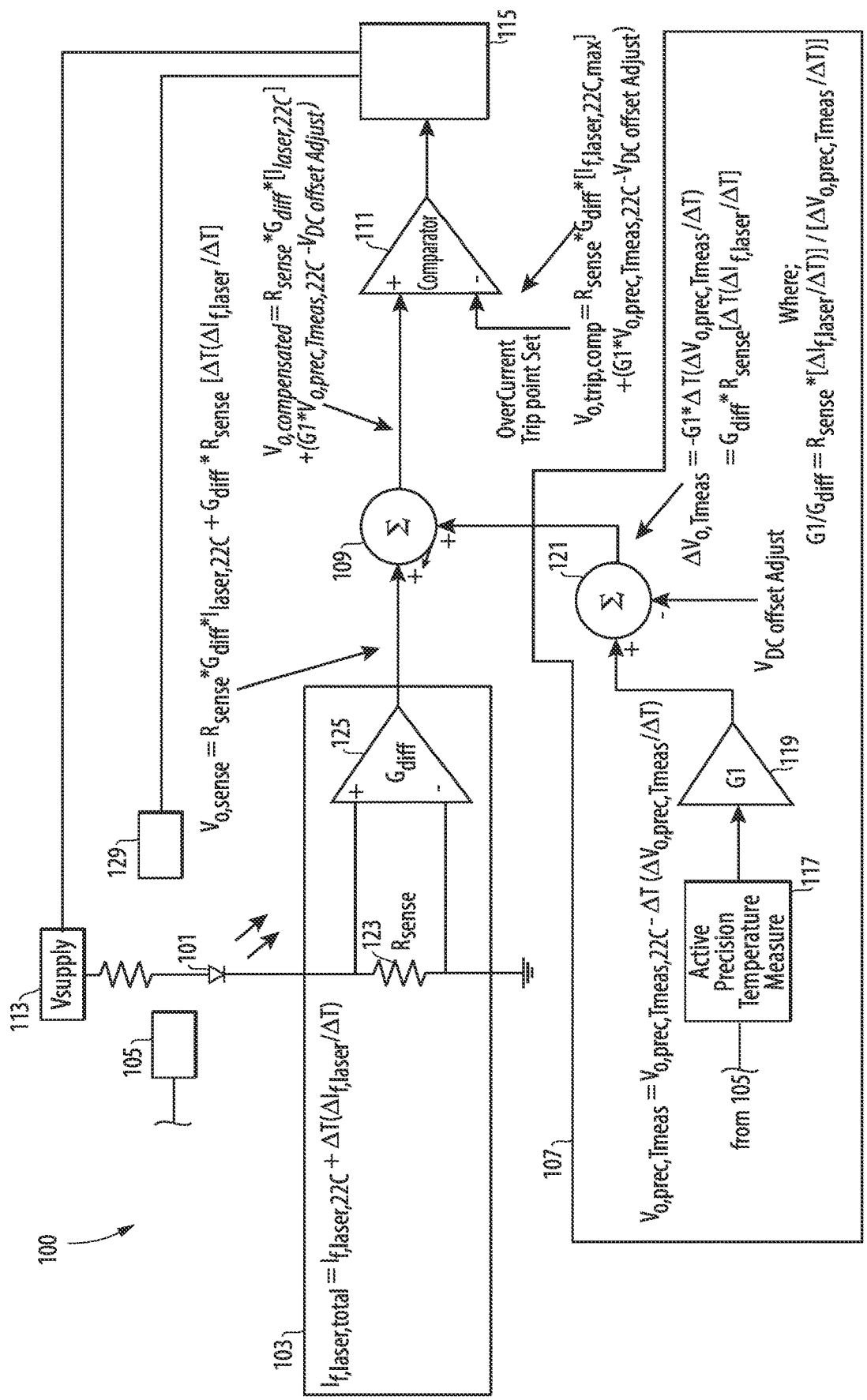

LASER DIODE DRIVE SYSTEMS

FIELD

This disclosure relates to laser diode drive systems.

BACKGROUND

In laser diode drive control loops, optical feedback via Si photodiodes is often used that measures the optical output power and adjusts the laser drive current as required over temperature. In safety critical systems where the optical output power of the laser diode cannot exceed a maximum value, the control loop will also measure the forward drive current of the laser diode in addition to the optical output power and turn off the drive circuitry if either exceeds a given threshold.

Such conventional methods and systems have generally been considered satisfactory for their intended purpose. However, there is still a need in the art for improved laser diode drive systems. The present disclosure provides a solution for this need.

SUMMARY

A laser diode drive system configured to output a drive signal to control a voltage provided to a laser diode can include a circuit sensor system configured to output a sensed signal indicative of a drive current of a laser diode, and a temperature sensor configured to output a temperature signal indicative of a temperature of the laser diode or an ambient temperature of the laser diode. The system can include a temperature compensation system configured to output a correction signal based on the temperature signal to compensate for a temperature dependent factor in the sensed signal.

The system can include a first sum block configured to sum the sensed signal and the correction signal to cancel the temperature dependent factor from the sensed signal. The first sum block is configured to output a compensated signal.

The sensed signal includes a standard temperature portion and a non-standard temperature induced portion at a non-standard temperature. The correction signal can be equal to or otherwise cancel the non-standard temperature induced portion in the sensed signal.

The system can include an overcurrent comparator configured to receive the compensated signal and an overcurrent threshold signal. The comparator can be configured to cause shut off of a voltage supply if the compensated signal exceeds the overcurrent threshold signal.

The temperature compensation system can include a precision module operatively connected to the temperature sensor and configured to output a temperature dependent signal based on a model and a temperature signal from the temperature sensor. The temperature compensation system can include a first gain block having a gain G1 operatively connected precision module to amplify the temperature dependent signal to match a magnitude of the non-standard temperature induced portion.

The temperature compensation system can include a second sum block configured to receive and sum the amplified temperature dependent signal and an offset adjust signal to modify the amplified temperature dependent signal for one or more known offsets. The second sum block can be configured to output the correction signal that matches the non-standard temperature induced portion of the sensed signal.

The sensed signal can be a sensed voltage $V_{o,sense}$, wherein the circuit sensor system includes a voltage sensor having a sense resistor having a resistance $R_{sense}$ and a sensor gain block having a gain $G_{diff}$ configured to amplify a sensor signal and to output the sensed voltage $V_{o,sense}$. The sensed voltage $V_{o,sense}$ can be represented by the following equation:

$$V_{o,sense} = G_{diff} * R_{sense} * I_{f,laser,22C} + G_{diff} * R_{sense} * [\Delta T(\Delta I_{f,laser}/\Delta T)],$$

where $I_{f,laser,22C}$ is a current component at a standard temperature, $\Delta I_{f,laser}/\Delta T$ is a laser diode drive current thermal coefficient, $\Delta T$ can be the difference in temperature between standard temperature and the sensed temperature. $G_{diff} * R_{sense} * I_{f,laser,22C}$ can be the component of sensed voltage existing at standard temperature and $G_{diff} * R_{sense} * [\Delta T(\Delta I_{f,laser}/\Delta T)]$ can be the non-standard temperature induced portion of the sensed voltage.

The temperature dependent signal of the precision module can be a total voltage $V_{o,prec,Tmeas}$ defined in accordance with the following equation:

$$V_{o,prec,Tmeas} = V_{o,prec,Tmeas,22C} - \Delta T(\Delta V_{o,prec,Tmeas}/\Delta T),$$

where $V_{o,prec,Tmeas,22C}$ is a calibration set point at standard temperature, and where $-(\Delta V_{o,prec,Tmeas}/\Delta T)$ is a negative thermal coefficient of active thermal measurement.

The correction signal output by the second sum block can be a correction voltage $\Delta V_{o,correction}$ represented by the following equation:

$\Delta V_{o,correction} = G1 * V_{o,prec,Tmeas,22C} - G1 * \Delta T * (\Delta V_{o,prec,Tmeas}/\Delta T) - V_{DC\ offset\ Adjust}$. In certain embodiments, $G1 * \Delta T * (\Delta V_{o,prec,Tmeas}/\Delta T) = G_{diff} * R_{sense} * [\Delta T(\Delta I_{f,laser}/\Delta T)] = \Delta V_{o,\ Tmeas}$, where $\Delta V_{o,\ Tmeas}$ is the non-standard temperature dependent component of the correction voltage $\Delta V_{o,correction}$.

In certain embodiments, the gain G1 and the gain $G_{diff}$ can be selected based on the following relationship:

$$G1/G_{diff} = R_{sense} * [(\Delta I_{f,laser}/\Delta T)/[\Delta V_{o,prec,Tmeas}/\Delta T)].$$

In certain embodiments, the first sum block can be configured to sum the sensed voltage $V_{o,sense}$ and the correction voltage $\Delta V_{o,correction}$ to output a compensated voltage $V_{o,compensated}$ defined by the following equation:

$$V_{o,compensated} = G_{diff} * R_{sense} * I_{f,laser,22C} + (G1 * V_{o,prec,Tmeas,22C} - V_{DC\ offset\ Adjust}).$$

In certain embodiments, the overcurrent threshold can be an overcurrent voltage $V_{o,trip,comp}$ represented by the following equation:

$$V_{o,trip,comp} = G_{diff} * R_{sense} * [I_{f,laser,22C,max}] + (G1 * [V_{o,prec,Tmeas,22C}] - V_{DC\ offset\ Adjust}),$$

where $I_{f,laser,22C}$,max is a drive current of laser required to achieve maximum allowed optical output power at standard temperature.

In certain embodiments, the system can include an optical power sensor, and a control module operatively connected to the overcurrent comparator and the optical power sensor. The control module can be configured to control the voltage supply to maintain a constant optical power output of the laser diode. The control module is configured to shut off the voltage supply if the overcurrent comparator indicates that the compensated sensed signal exceeds the overcurrent threshold signal. In certain embodiments, the system can be entirely hardware implemented. Any other suitable formula, models, and/or process for compensating for temperature effects in a laser drive system are contemplated herein.

In accordance with at least one aspect of this disclosure, a laser diode drive system can include a voltage source for driving a laser diode, an overcurrent trip system configured to shut off the voltage source for the laser diode in at an overcurrent threshold, and a temperature dependent drive current compensation system configured to modify the overcurrent threshold or to modify an input to the overcurrent trip system to compensate for temperature dependent current increase required to maintain a fixed optical output of the laser diode to prevent shutting off the voltage source prematurely. The system can be any suitable system disclosed herein and/or include any other suitable components disclosed herein.

In accordance with at least one aspect of this disclosure, a method can include compensating for a temperature dependent portion of a sensed voltage in a laser power control system to prevent early overcurrent protection tripping. The method can include maintaining a constant optical output of a laser diode while compensating for the temperature dependent portion.

In certain embodiments, the method can include sensing temperature of or ambient to the laser diode to determine the temperature dependent portion of the sensed voltage. The method can include generating an equal and opposite correction voltage based on the determined temperature dependent portion and summing the correction voltage with the sensed voltage to remove the temperature dependent portion of the sensed voltage and to output a compensated voltage that is temperature invariant.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

FIG. 1 is a schematic diagram of an embodiment of a laser diode drive system in accordance with this disclosure.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100.

Referring to FIG. 1, a laser diode drive system 100 configured to output a drive signal to control a voltage provided to a laser diode 101 can include a circuit sensor system 103 configured to output a sensed signal (e.g., a voltage, a current) indicative of a drive current of a laser diode 101. The system 100 can also include a temperature sensor 105 configured to output a temperature signal indicative of a temperature of the laser diode 101 or an ambient temperature of the laser diode 101. The system 100 can include a temperature compensation system 107 configured to output a correction signal based on the temperature signal to compensate for a temperature dependent factor in the sensed signal.

The system 100 can include a first sum block 109 configured to sum the sensed signal and the correction signal to cancel the temperature dependent factor from the sensed signal. The first sum block 109 can be configured to output a compensated signal, for example (e.g., as shown in FIG. 1).

The sensed signal can include a standard temperature portion (a portion that exists at a standard temperature) and a non-standard temperature induced portion at a non-standard temperature. For example, the non-standard temperature induced portion can be an increased current resulting from a non-standard temperature of the laser diode requiring a higher current to maintain a constant, selected optical output. In certain embodiments, the correction signal can be equal to or otherwise cancel the non-standard temperature induced portion in the sensed signal. FIG. 1 shows embodiments of voltages at various portions of the system 100.

The system 100 can include an overcurrent comparator 111 configured to receive the compensated signal and an overcurrent threshold signal (e.g., overcurrent trip point set). The comparator 111 can be configured to cause shut off of a voltage supply 113 if the compensated signal exceeds the overcurrent threshold signal (e.g., by outputting a signal or not outputting a signal to a control module 115).

The temperature compensation system 100 can include a precision module 117 operatively connected to the temperature sensor 105 and configured to output a temperature dependent signal based on a model (e.g., as shown in FIG. 1 above precision module 117) and a temperature signal from the temperature sensor 105. The model can be a voltage relationship comprising a voltage component at standard temperature and a voltage component at non-standard temperature (e.g., the relationship being a function of a change in temperature relative to the standard temperature). The temperature compensation system 107 can include a first gain block 119 having a gain G1 operatively connected precision module 117 to amplify the temperature dependent signal to match a magnitude of the non-standard temperature induced portion of the sensed signal.

The temperature compensation system 107 can include a second sum block 121 configured to receive and sum the amplified temperature dependent signal and an offset adjust signal to modify the amplified temperature dependent signal for one or more known offsets (e.g., sensing error, etc.). The second sum block 121 can be configured to output the correction signal that matches and/or otherwise cancels the non-standard temperature induced portion of the sensed signal (e.g., to remove the temperature dependency from the sensed signal such that the compensated signal does not include a temperature dependency).

In certain embodiments, the sensed signal can be a sensed voltage $V_{o,sense}$, wherein the circuit sensor system 103 includes a voltage sensor having a sense resistor 123 having a resistance $R_{sense}$ and a sensor gain block 125 having a gain $G_{diff}$ configured to amplify a sensor signal and to output the sensed voltage $V_{o,sense}$. The sensed voltage $V_{o,sense}$ can be represented by the following equation:

$$V_{o,sense} = G_{diff} * R_{sense} * I_{f,laser,22C} + G_{diff} * R_{sense} * [\Delta T(\Delta I_{f,laser}/\Delta T],$$

where $I_{f,laser,22C}$ is a current component at a standard temperature, $\Delta I_{f,laser}/\Delta T$ is a laser diode drive current thermal coefficient, $\Delta T$ can be the difference in temperature between standard temperature and the sensed temperature. $G_{diff} * R_{sense} * I_{f,laser,22C}$ can be the component of sensed voltage existing at standard temperature and $G_{diff} * R_{sense} * [\Delta T$ ($\Delta I_{f,laser}/\Delta T$] can be the non-standard temperature induced portion of the sensed voltage.

The temperature dependent signal of the precision module can be a total voltage $V_{o,prec,Tmeas}$ defined in accordance with the following equation:

$$V_{o,prec,Tmeas} = V_{o,prec,Tmeas,22C} - \Delta T(\Delta V_{o,prec,Tmeas}/\Delta T),$$

where $V_{o,prec,Tmeas,22C}$ is a calibration set point at standard temperature, and where $-(\Delta V_{o,prec,Tmeas}/\Delta T)$ is a negative thermal coefficient of active thermal measurement.

The correction signal output by the second sum block 121 can be a correction voltage $\Delta V_{o,correction}$ represented by the following equation:

$$\Delta V_{o,correction} = G1*V_{o,prec,Tmeas,22C} - G1*\Delta T*(\Delta V_{o,prec,Tmeas}/\Delta T) - V_{DC\ offset\ Adjust}.$$

In certain embodiments, $G1*\Delta T*(\Delta V_{o,prec,Tmeas}/\Delta T) = G_{diff}*R_{sense}*[\Delta T(\Delta I_{f,laser}/\Delta T] = \Delta V_{0,Tmeas}$, where $\Delta V_{0,Tmeas}$ is the non-standard temperature dependent component of the correction voltage $\Delta V_{o,correction}$.

In certain embodiments, the gain G1 and the gain $G_{diff}$ can be selected based on the following relationship:

$$G1/G_{diff} = R_{sense}*[(\Delta I_{f,laser}/\Delta T)/(\Delta V_{o,prec,Tmeas}/\Delta T)].$$

In certain embodiments, the first sum block 109 can be configured to sum the sensed voltage $V_{o,sense}$ and the correction voltage $\Delta V_{o,correction}$ to output a compensated voltage $V_{o,compensated}$ defined by the following equation:

$$V_{o,compensated} = G_{diff}*R_{sense}*I_{f,laser,22C} + (G1*V_{o,prec,Tmeas,22C} - V_{DC\ offset\ Adjust}).$$

In certain embodiments, the overcurrent threshold can be an overcurrent voltage $V_{o,trip,comp}$ represented by the following equation:

$$V_{o,trip,comp} = G_{diff}*R_{sense}*[I_{f,laser,22C,max}] + (G1*[V_{o,prec,Tmeas,22C}] - V_{DC\ offset\ Adjust}),$$

where $I_{f,laser,22C}$,max is a drive current of laser required to achieve maximum allowed optical output power at standard temperature.

In certain embodiments, the system 100 can include an optical power sensor 129, and a control module 115 operatively connected to the overcurrent comparator 111 and the optical power sensor 129. The control module 115 can be configured to control the voltage supply 113 to maintain a constant optical power output of the laser diode 101, for example (which can increase the current above a fixed overcurrent threshold in non-standard temperature of the laser/ambient to the laser if temperature dependency is not removed from the signal input to the comparator 111). The control module 115 is configured to shut off the voltage supply 113 if the overcurrent comparator indicates that the compensated sensed signal exceeds the overcurrent threshold signal. In certain embodiments, the system 100 can be entirely hardware implemented (e.g., circuit logic components). However, it is contemplated that any suitable component(s) can be implemented as software/firmware, and any signals can be analog or digital, for example. Any other suitable formula, models, and/or process for compensating for temperature effects in a laser drive system are contemplated herein.

In accordance with at least one aspect of this disclosure, a laser diode drive system can include a voltage source for driving a laser diode, an overcurrent trip system configured to shut off the voltage source for the laser diode in at an overcurrent threshold, and a temperature dependent drive current compensation system configured to modify the overcurrent threshold or to modify an input to the overcurrent trip system to compensate for temperature dependent current increase required to maintain a fixed optical output of the laser diode to prevent shutting off the voltage source prematurely. The system can be any suitable system disclosed herein and/or include any other suitable components disclosed herein.

In accordance with at least one aspect of this disclosure, a method can include compensating for a temperature dependent portion of a sensed voltage in a laser power control system to prevent early overcurrent protection tripping. The method can include maintaining a constant optical output of a laser diode while compensating for the temperature dependent portion.

In certain embodiments, the method can include sensing temperature of or ambient to the laser diode to determine the temperature dependent portion of the sensed voltage. The method can include generating an equal and opposite correction voltage based on the determined temperature dependent portion and summing the correction voltage with the sensed voltage to remove the temperature dependent portion of the sensed voltage and to output a compensated voltage that is temperature invariant.

In laser diode drive control loops, optical feedback via Si photodiodes is often used that measures the optical output power and adjusts the laser drive current as required over temperature. In safety critical systems (e.g., disposed in fuel systems with flammable fuel) where the optical output power of the laser diode cannot exceed a maximum value, the control loop will also measure the forward drive current of the laser diode in addition to the optical output power and turn off the drive circuitry if either exceeds a given threshold. Laser diodes will exhibit a decrease in optical output power for the same applied forward current as the operating temperature increases. Thus, an increase in forward current is required to maintain the same optical power in any laser diode as the ambient temperature increases.

If the overcurrent threshold is set at ambient for the laser diode circuitry, then the increase in drive current as the operating temperature increases will eventually cause the overcurrent threshold to be exceeded resulting in unwanted shut-down of the driver if the current threshold is not adjusted for the thermal drift of the laser diode forward current. Embodiments provide a technique for monitoring the ambient thermal environment of the laser diode and compensating for the drift in the drive current such that the overcurrent threshold for the defined operating output power at ambient is not exceeded over the required thermal operating environment.

An embodiment detailing logic of one or more embodiments is disclosed below. The forward drive current of a laser diode operating at a constant optical output power has a positive temperature coefficient that can be written as:

$$\Delta I_{f,laser}/\Delta T \qquad \text{Eqn(1)}$$

where $\Delta I_{f,laser}$=change in laser current and $\Delta T$=change between calibrated temp (e.g., 22 C) and sensed temp.

Thus, the total drive current at any temperature can be expressed as the ambient drive current plus the thermal delta;

$$I_{f,laser,total} = I_{f,laser,22C} \Delta T(\Delta I_{f,laser}/\Delta T) \qquad \text{Eqn(2)}$$

where $I_{f,laser,total}$=total drive current, $I_{f,laser,22C}$=the drive current at standard temperature (e.g., 22 C), and $\Delta T(\Delta I_{f,laser}/\Delta T)$=is the change in current due to temperature.

In the embodiment shown in FIG. 1, the drive current can be monitored via a low resistance sense network that converts the sensed laser diode current ($R_{sense}$ times total current-term in brackets) to an equivalent voltage and multiples it by a gain=$G_{diff}$.

$$V_{o,sense} = G_{diff} * R_{sense} * [I_{f,laser,22C} \Delta T (\Delta I_{f,laser}/\Delta T)] \quad \text{Eqn(3)}$$

$$= G_{diff} * R_{sense} * I_{f,laser,22C} G_{diff} * R_{sense} * [\Delta T (\Delta I_{f,laser}/\Delta T)] \quad \text{Eqn(3a)}$$

The term $G_{diff} * R_{sense} * [\Delta T (\Delta I_{f,laser}/\Delta T)]$ in equation (3a) above represents the net change in the sensed drive current as a function of temperature. This can be written as;

$$\Delta V_{o,sense,temp} = G_{diff} * R_{sense} * [\Delta T (\Delta I_{f,laser}/\Delta T)] \quad \text{Eqn(3b)}$$

The diode overcurrent sense is typically set to the drive current required to achieve the maximum allowed optical power at T=22° C. Thus, as the ambient temperature increases, the optical feedback in the laser diode drive circuitry will increase the forward current to maintain the same optical power.

This can result in the undesired turn-off of the diode drive circuitry at elevated ambient operating temperatures particularly if the operating optical power and the maximum allowed optical power are close.

To compensate for this positive temperature coefficient, an equal but negative voltage is created to cancel out Eqn(3b) as shown below:

$$\Delta V_{o,temp} = -G_{diff} * R_{sense} * [\Delta T (\Delta I_{f,laser}/\Delta T)] \quad \text{Eqn(4)}$$

When Eqn(4) and (3a) are added, the temperature dependence on the measured overcurrent trip point is removed resulting only in the original T=22° C. setpoint value resulting in Eqn(5) shown below.

$$V_{o,trip,comp} = G_{diff} * R_{sense} * [I_{f,laser,22C,max}] + V_{offset,Temperature\ leg} \quad \text{Eqn(5)}$$

where $I_{f,laser,22C,max}$=drive current of laser required to achieve maximum allowed optical output power at standard temperature (e.g., 22 C) and $V_{offset,Temperature\ leg}$=DC offset term dependent on gain and offset of Temperature compensation leg.

Equation (4) can be written in terms of actual temperature compensation leg circuitry. The temperature compensation leg of the circuit is accomplished using a precision temperature measurement device. that exhibits a negative temperature coefficient defined as;

$$-(\Delta V_{o,prec,Tmeas}/\Delta T) \quad \text{Eqn(6)}$$

With a high precision calibration set point at T=22 C defined as:

$$V_{o,prec,Tmeas,22C} \quad \text{Eqn(7)}$$

For a Total temperature measurement output voltage of:

$$V_{o,prec,Tmeas} = V_{o,prec,Tmeas,22C} - \Delta T (\Delta V_{o,prec,Tmeas}/\Delta T) \quad \text{Eqn(8)}$$

Equation (8) is now passed through a gain/offset stage so that it can be set equal to eqn(3a) and cancel out the net effect of the laser diode current change with temperature. Multiplying equation (8) by gain=G1 and applying offset=$-V_{DC\ offset\ Adjust}$ yields;

$$V_{o,correction} = G1 * [V_{o,prec,Tmeas,22C} - \Delta T (\Delta V_{o,prec,Tmeas}/\Delta T)] - V_{DC\ offset\ Adjust} \quad \text{Eqn(9)}$$

The temperature dependent terms of equation (3) and Equation (9) are now set equal to each other to establish a relationship for Gaff, G1 as follows:

$$G1/G_{diff} = R_{sense} * [\Delta I_{f,laser}/\Delta T] / [\Delta V_{o,prec,Tmeas}/\Delta T] \quad \text{Eqn(10)}$$

where $R_{sense}$ is the current sense resistor value, $\Delta I_{f,laser}/\Delta T$ is the laser diode drive current thermal coefficient, and $-\Delta V_{o,prec,Tmeas}/\Delta T$ is the negative thermal coefficient of active thermal measurement IC. G1 and $G_{diff}$ can now be chosen per Eqn(10).

With the temperature leg values chosen per Eqn(10) the final setpoint for the overcurrent threshold can be determined by setting $V_{offset,Temperature\ leg}$ term of Eqn(5) equal to the temperature invariant terms of Eqn(9). The final voltage used for the overcurrent sense trip point is now independent of temperature variance and is shown below:

$$V_{o,trip,comp} = G_{diff} * R_{sense} * [I_{f,laser,22C,max}] + G1 * [V_{o,prec,Tmeas,22C}] - V_{DC\ offset\ Adjust} \quad \text{Eqn(11)}$$

With included temperature compensation, embodiments of the laser diode drive circuitry can now supply the desired constant optical output power over a required temperature range without activating the overcurrent sense circuitry unnecessarily. In embodiments, if optical power exceeds the maximum defined operating value, the over current sense circuitry will shut off the driver as intended.

Embodiments include a method for thermal compensation of forward drive current in a laser diode. Embodiments can monitor the ambient thermal environment of a laser diode and compensate for the drift in the drive current such that the overcurrent threshold for the defined operating output power at ambient is not exceeded over a required thermal operating environment. In safety critical systems, for example, where the optical output power of a laser diode cannot exceed a maximum value, the control loop can measure the forward drive current of the laser diode in addition to the optical output power and turn off the drive circuitry if either exceeds a given threshold. Embodiments can provide a means for monitoring the ambient thermal environment of a laser diode and compensating for the drift in the drive current such that the overcurrent threshold for the defined operating output power at ambient is not exceeded over the required thermal operating environment resulting in false failures of circuitry operating in the field.

Certain embodiments can be implemented as strictly hardware electrical components, for example. In certain embodiments, however, aspects of this invention can include or be embodied as software or any combination of hardware and software. Accordingly, as will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A laser diode drive system configured to output a drive signal to control a voltage provided to a laser diode, comprising: a circuit sensor system configured to output a sensed signal indicative of a drive current of a laser diode; a temperature sensor configured to output a temperature signal indicative of a temperature of the laser diode or an ambient temperature of the laser diode; and a temperature compensation system configured to output a correction signal based on the temperature signal to compensate for a temperature dependent factor in the sensed signal;

further comprising a first sum block configured to sum the sensed signal and the correction signal to cancel the temperature dependent factor from the sensed signal, wherein the first sum block is configured to output a compensated signal;

wherein the sensed signal includes a standard temperature portion and a non-standard temperature induced portion at a non-standard temperature, wherein the correction signal is equal to or otherwise cancel the non-standard temperature induced portion in the sensed signal.

2. The system of claim 1, wherein the system comprises an overcurrent comparator configured to receive the compensated signal and an overcurrent threshold signal, wherein the comparator is configured to cause shut off of a voltage supply if the compensated signal exceeds the overcurrent threshold signal.

3. The system of claim 2, wherein the temperature compensation system includes a precision module operatively connected to the temperature sensor and configured to output a temperature dependent signal based on a model and a temperature signal from the temperature sensor.

4. The system of claim 3, wherein the temperature compensation system includes a first gain block having a gain G1 operatively connected precision module to amplify the temperature dependent signal to match a magnitude of the non-standard temperature induced portion.

5. The system of claim 4, wherein the temperature compensation system includes a second sum block configured to receive and sum the amplified temperature dependent signal and an offset adjust signal to modify the amplified temperature dependent signal for one or more known offsets, wherein the second sum block is configured to output the correction signal that matches the non-standard temperature induced portion of the sensed signal.

6. The system of claim 5, wherein the sensed signal is a sensed voltage $V_{o,sense}$, wherein the circuit sensor system includes a voltage sensor having a sense resistor having a resistance $R_{sense}$ and a sensor gain block having a gain $G_{diff}$ configured to amplify a sensor signal and to output the sensed voltage $V_{o,sense}$, and wherein the sensed voltage $V_{o,sense}$ is represented by the following equation:

$$V_{o,sense} = G_{diff}*R_{sense}*I_{f,laser,22C} + G_{diff}*R_{sense}*[\Delta T(\Delta I_{f,laser}/\Delta T)],$$

wherein $I_{f,laser,22C}$ is a current component at a standard temperature, and wherein $\Delta I_{f,laser}/\Delta T$ is a laser diode Drive current thermal coefficient, wherein $\Delta T$ is the difference in temperature between standard temperature and the sensed temperature, such that $G_{diff}*R_{sense}*I_{f,laser,22C}$ is the component of sensed voltage existing at standard temperature and $G_{diff}*R_{sense}*[\Delta T(\Delta I_{f,laser}/\Delta T)]$ is the non-standard temperature induced portion of the sensed voltage.

7. The system of claim 6, wherein the temperature dependent signal of the precision module is a total voltage $V_{o,prec,Tmeas}$ defined in accordance with the following equation:

$$V_{o,prec,Tmeas} = V_{o,prec,Tmeas,22C} - \Delta T(\Delta V_{o,prec,Tmeas}/\Delta T),$$

wherein $V_{o,prec,Tmeas,22C}$ is a calibration set point at standard temperature, and wherein $-(\Delta V_{o,prec,Tmeas}/\Delta T)$ is a negative thermal coefficient of active thermal measurement.

8. The system of claim 7, wherein the correction signal output by the second sum block is a correction voltage $\Delta V_{o,correction}$ represented by the following equation:

$$\Delta V_{o,correction} = G1*V_{o,prec,Tmeas,22C} - G1*\Delta T*(\Delta V_{o,prec,Tmeas}/\Delta T) - V_{DC\ offset\ Adjust}, \text{ wherein}$$

$G1*\Delta T*(\Delta V_{o,prec,Tmeas}/\Delta T) = G_{diff}*R_{sense}*[\Delta T(\Delta I_{f,laser}/\Delta T)] = V_{0,Tmeas}$, wherein $V_{0,Tmeas}$ is the non-standard temperature dependent component of the correction voltage $\Delta V_{o,correction}$.

9. The system of claim 8, wherein the gain G1 and the gain $G_{diff}$ are selected based on the following relationship:

$$G1/G_{diff} = R_{sense}*[(\Delta I_{f,laser}/\Delta T)/(\Delta V_{o,prec,Tmeas}/\Delta T)].$$

10. The system of claim 9, wherein the first sum block is configured to sum the sensed voltage $V_{o,sense}$ and the correction voltage $\Delta V_{o,correction}$ to output a compensated voltage $V_{o,compensated}$ defined by the following equation:

$$V_{o,compensated} = G_{diff}*R_{sense}*I_{f,laser,22C} + (G1* V_{o,prec,Tmeas,22C} - V_{DC\ offset\ Adjust}).$$

11. The system of claim 10, wherein the overcurrent threshold is an overcurrent voltage $V_{o,trip,comp}$ represented by the following equation:

$$V_{o,trip,comp} = G_{diff}*R_{sense}*[I_{f,laser,22C,max}] + (G1*[V_{o,prec,Tmeas,22C}] - V_{DC\ offset\ Adjust}),$$

wherein $I_{f,laser,22C,max}$ is a drive current of laser required to achieve maximum allowed optical output power at standard temperature.

12. The system of claim 11, wherein the system includes: an optical power sensor; and a control module operatively connected to the overcurrent comparator and the optical power sensor, wherein the control module is configured to control the voltage supply to maintain a constant optical power output of the laser diode, wherein the control module is configured to shut off the voltage supply if the overcurrent comparator indicates that the compensated sensed signal exceeds the overcurrent threshold signal.

* * * * *